(12) United States Patent
Nihei (10) Patent No.: US 12,438,531 B2
(45) Date of Patent: Oct. 7, 2025

(54) DELAY TIME CONTROL CIRCUIT

(71) Applicant: LAPIS Technology Co., Ltd., Yokohama (JP)

(72) Inventor: Daisuke Nihei, Yokohama (JP)

(73) Assignee: LAPIS TECHNOLOGY CO., LTD., Yokohama (JP)

( * ) Notice: Subject to any disclaimer, the term of this patent is extended or adjusted under 35 U.S.C. 154(b) by 43 days.

(21) Appl. No.: 18/619,422

(22) Filed: Mar. 28, 2024

(65) Prior Publication Data
US 2024/0333272 A1 Oct. 3, 2024

(30) Foreign Application Priority Data
Mar. 29, 2023 (JP) ................. 2023-054258

(51) Int. Cl.
*H03K 5/13* (2014.01)
*H03K 7/08* (2006.01)
*H03K 5/00* (2006.01)

(52) U.S. Cl.
CPC ............. *H03K 5/13* (2013.01); *H03K 7/08* (2013.01); *H03K 2005/00019* (2013.01)

(58) Field of Classification Search
CPC .. H03K 5/13; H03K 7/08; H03K 2005/00019; H02M 1/36
USPC ......................................... 327/276
See application file for complete search history.

(56) References Cited

U.S. PATENT DOCUMENTS

| | | | | |
|---|---|---|---|---|
| 11,316,507 | B2* | 4/2022 | Hernandez | H03K 7/08 |
| 12,046,990 | B1* | 7/2024 | Xu | H02M 1/0025 |
| 2007/0132449 | A1* | 6/2007 | Madni | G01D 5/246 |
| | | | | 324/207.25 |
| 2013/0069734 | A1* | 3/2013 | Matoba | H03K 7/08 |
| | | | | 332/109 |
| 2014/0229755 | A1* | 8/2014 | Kris | H02J 1/102 |
| | | | | 713/340 |
| 2015/0028851 | A1 | 1/2015 | Ohori et al. | |
| 2015/0340953 | A1* | 11/2015 | Shook | H03K 7/08 |
| | | | | 323/271 |
| 2019/0103862 | A1* | 4/2019 | Ido | H03F 3/2173 |
| 2019/0195923 | A1 | 6/2019 | Ohori et al. | |
| 2021/0270874 | A1 | 9/2021 | Ohori et al. | |
| 2024/0333272 | A1* | 10/2024 | Nihei | H03K 7/08 |
| 2025/0038742 | A1* | 1/2025 | Nihei | H03K 7/08 |

FOREIGN PATENT DOCUMENTS

JP 2015-037348 A 2/2015

\* cited by examiner

*Primary Examiner* — Ryan Jager
(74) *Attorney, Agent, or Firm* — Rabin & Berdo, P.C.

(57) ABSTRACT

A delay time control circuit, wherein the delay time control circuit outputs a delay signal to a signal output circuit for outputting a PWM signal to an output circuit, the delay signal being an instruction to stop output of the PWM signal after elapse of a predetermined delay time from an end of a cycle of the PWM signal being output by the signal output circuit.

5 Claims, 6 Drawing Sheets

DELAY TIME CONTROL CIRCUIT

CROSS-REFERENCE TO RELATED APPLICATION

This application is based on and claims priority under 35 USC 119 from Japanese Patent Application No. 2023-054258 filed on Mar. 29, 2023, the disclosure of which is incorporated by reference herein.

BACKGROUND

Technical Field

The present disclosure relates to a delay time control circuit.

Related Art

Japanese Patent Application Laid-Open (JP-A) No. 2015-037348 discloses a stop circuit including a phase delay means that delays a timing phase synchronized with another inverter device by a specific value, and a stop signal output means that outputs a stop signal to stop an inverter circuit at a timing in accordance with the delayed timing phase. When the stop signal from the stop circuit is input to a control circuit, generation of a pulse width modulation (PWM) signal is stopped. A power conversion operation of the inverter circuit is stopped due to input of the PWM signal from the control circuit stopping. The stop circuit disclosed in JP-A No. 2015-037348 stops the inverter circuit at a timing different to the other inverter circuit, and so this enables a reduction in any effect stopping the inverter circuit has on a power system.

The control circuit that controls an output voltage output by an output circuit using the PWM signal, continues output of the PWM signal until after elapse of the cycle of the PWM signal being output so as to achieve a certain output voltage when the output of the PWM signal is stopped, and stops output of the PWM signal at the end of the cycle. However, an issue arises in that output of the PWM signal sometimes stops at a point at which the output voltage after the end of the cycle is higher than a predetermined voltage threshold (hereinafter simply referred to as "voltage threshold") due to differences in characteristics of components configuring the output circuit.

The present disclosure provides a delay time control circuit capable of stopping output of a PWM signal at a point at which an output voltage is a voltage threshold or lower.

SUMMARY

A delay time control circuit according to the present disclosure outputs a delay signal to a signal output circuit for outputting a PWM signal to an output circuit, the delay signal being an instruction to stop output of the PWM signal after elapse of a predetermined delay time from an end of a cycle of the PWM signal being output by the signal output circuit.

BRIEF DESCRIPTION OF THE DRAWINGS

Exemplary embodiments of the present disclosure will be described in detail based on the following figures, wherein.

DETAILED DESCRIPTION

The present disclosure exhibits the excellent advantageous effect of being able to stop output of a PWM signal at a point at which an output voltage is a voltage threshold or lower.

Description follows regarding an example of an exemplary embodiment of the present disclosure, with reference to the drawings. Note that the same reference numerals will be appended in the drawings to the same or equivalent configuration elements and parts. Moreover, dimensions and proportions in the drawings are exaggerated for ease of explanation, and sometimes differ from actual proportions.

First, before describing an exemplary embodiment of the present disclosure, description follows regarding a power source system 100 according to related technology.

Figure 1:
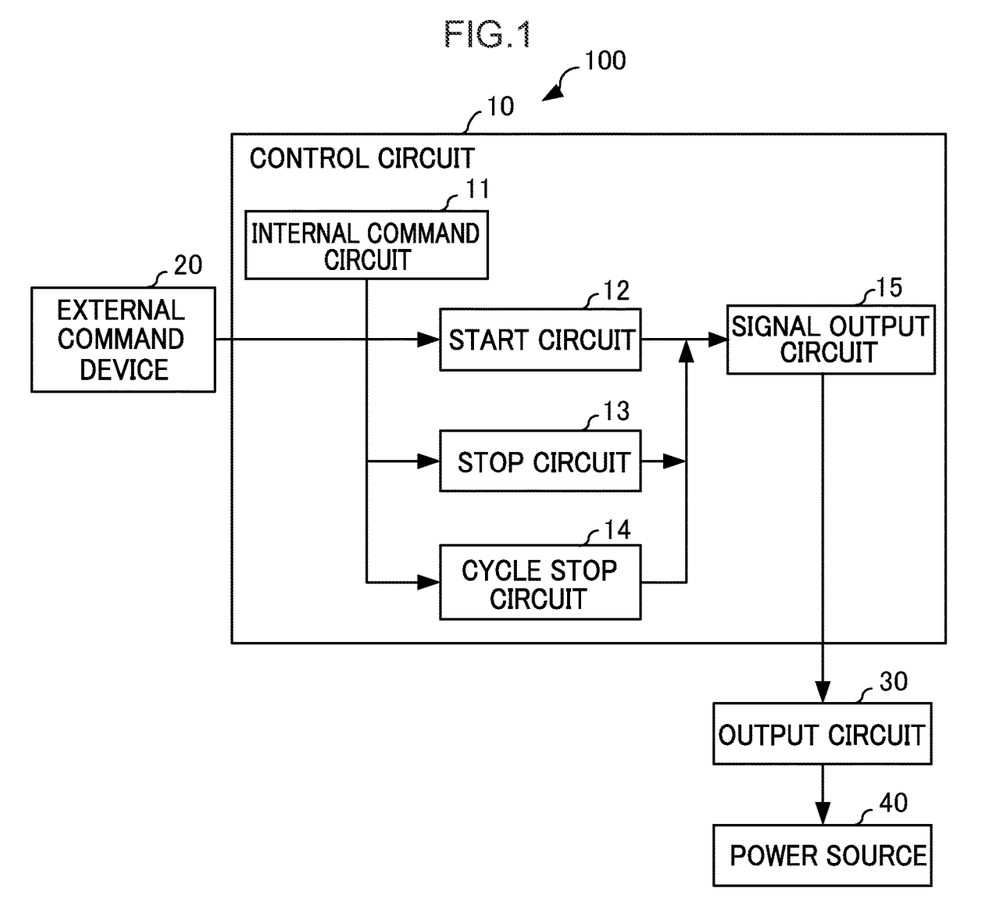
FIG. 1 is a block diagram illustrating an example of a hardware configuration of a power source system according to related technology.

FIG. 1 illustrates a schematic configuration of a power source system 100 according to related technology. As illustrated in FIG. 1, a power source system 100 according to related technology includes a control circuit 10, an external command device 20, an output circuit 30, and a power source 40.

The external command device 20 outputs a generated command signal to the control circuit 10.

The output circuit 30 outputs a direct current voltage to the power source 40. Hereafter the direct current voltage output by the output circuit 30 is called the output voltage.

The control circuit 10 is a circuit for controlling the output voltage using a PWM signal and, for example, may be implemented by a microcomputer or the like. As illustrated in FIG. 1, the control circuit 10 includes an internal command circuit 11, a start circuit 12, a stop circuit 13, a cycle stop circuit 14, and a signal output circuit 15.

The internal command circuit 11 is a circuit that outputs a command signal to at least one out of the start circuit 12, the stop circuit 13, or the cycle stop circuit 14.

The start circuit 12 is a circuit that outputs a startup signal that instructs startup of the signal output circuit 15.

The stop circuit 13 is a circuit that outputs a stop signal that instructs stopping of the output of the PWM signal.

The cycle stop circuit 14 is a circuit that outputs a cycle stop signal that instructs stopping of output of the PWM signal from an end of a cycle of the PWM signal being output by the signal output circuit 15.

The signal output circuit 15 is a circuit that outputs the PWM signal to the output circuit 30. Specifically, the signal output circuit 15 generates the PWM signal based on a carrier signal and a command signal using a triangle wave comparison method. For example, the signal output circuit 15 generates, as the PWM signal, a pulse signal that is high level when the command signal is greater than the carrier signal, and that is low level when the command signal is the carrier signal or lower. Note that the signal output circuit 15 is not limited to generating a PWM signal by a triangle wave comparison method and, for example, may be configured so as to generate a PWM signal using a hysteresis method. The signal output circuit 15 outputs the generated PWM signal to the output circuit 30.

Next, description follows regarding a functional configuration of the control circuit 10 according to related technology.

The internal command circuit 11 outputs a command signal to at least one out of the start circuit 12, the stop circuit 13, or the cycle stop circuit 14.

On receipt of the command signal from the internal command circuit 11 or from the external command device 20, the start circuit 12 outputs a startup signal to the signal output circuit 15.

On receipt of the command signal from the internal command circuit 11 or from the external command device 20, the stop circuit 13 outputs a stop signal to the signal output circuit 15.

On receipt of the command signal from the internal command circuit 11 or from the external command device 20, the cycle stop circuit 14 outputs a cycle stop signal to the signal output circuit 15.

On receipt of the startup signal from the start circuit 12, the signal output circuit 15 generates a PWM signal. The signal output circuit 15 then starts to output the generated PWM signal to the output circuit 30.

Moreover, on receipt of the stop signal from the stop circuit 13, the signal output circuit 15 stops generation of the PWM signal. The signal output circuit 15 then stops output of the PWM signal to the output circuit 30.

Moreover, on receipt of the cycle stop signal from the cycle stop circuit 14, the signal output circuit 15 continues to output the PWM signal until an end of the cycle of the PWM signal being output when the cycle stop signal was received. In the following, the cycle of the PWM signal being output when the signal output circuit 15 has received the cycle stop signal is called a first PWM cycle. Then at the end of the first PWM cycle, the signal output circuit 15 stops output of the PWM signal to the output circuit 30.

When the signal output circuit 15 receives the stop signal and stops output of the PWM signal, the output circuit 30 does not have a certain output voltage at the point in time when the output of the PWM signal stops. Therefore generally speaking, in order to achieve a certain output voltage of the output circuit 30 when output of the PWM signal stops, the signal output circuit 15 stops output of the PWM signal at the end of the first PWM cycle.

Figure 2:
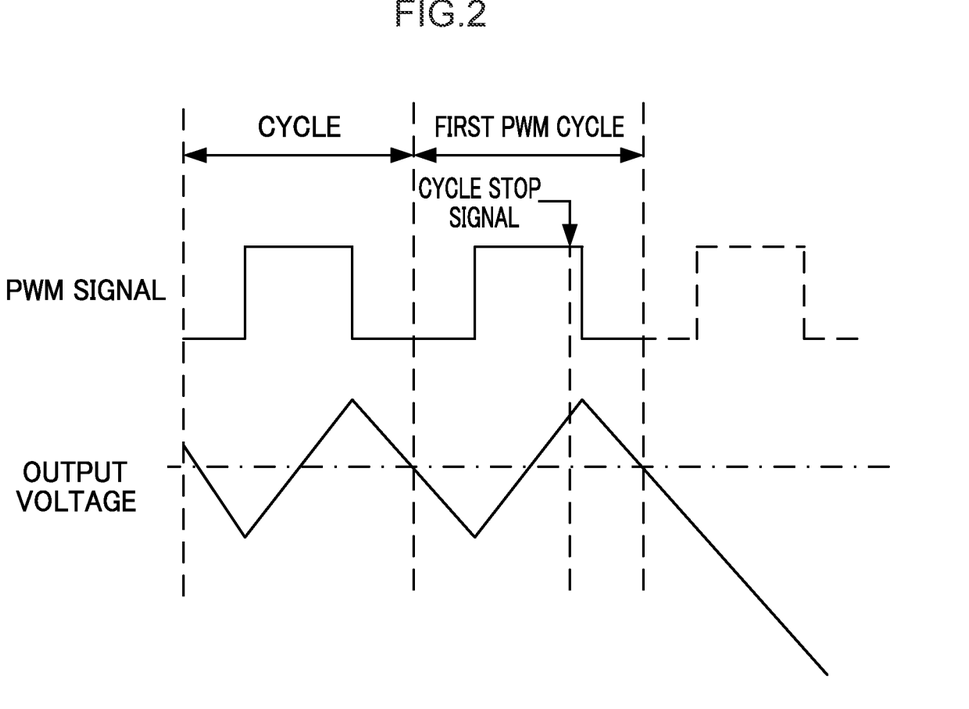
FIG. 2 is a schematic diagram to accompany description of an output voltage at an end of a cycle of a PWM signal.

FIG. 2 illustrates an example of a PWM signal at the top of FIG. 2 and a corresponding output voltage at the bottom of FIG. 2. As illustrated by the single-dot broken line at the bottom of FIG. 2, the output voltage at the end of the cycles of the PWM signal is constant for whichever cycle.

However, due to differences in characteristics of components configuring the output circuit 30, the output voltage at the end of the first PWM cycle is sometimes not a voltage threshold or lower. The voltage threshold is predetermined by a user. This means that sometimes the signal output circuit 15 stops output of the PWM signal when the output voltage is higher than the voltage threshold.

Figure 3:
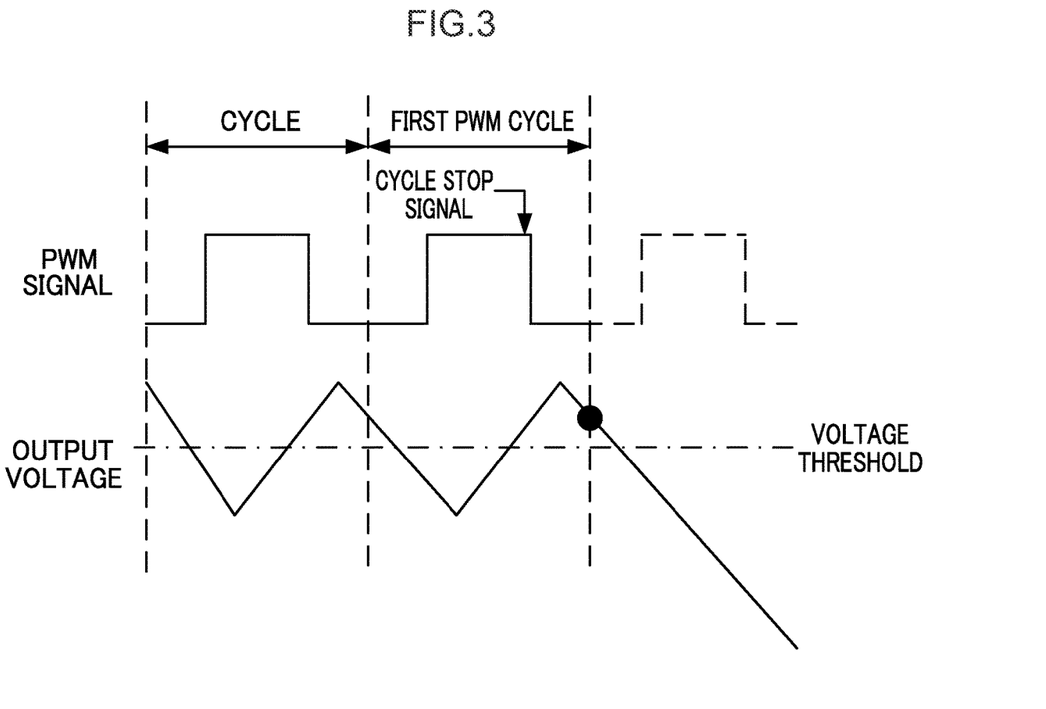
FIG. 3 is a schematic diagram to accompany description of an output voltage at an end of a first cycle of a PWM signal.

FIG. 3 illustrates an example of a PWM signal at the top of FIG. 3 and a corresponding output voltage at the bottom of FIG. 3. As illustrated in FIG. 3, an output voltage of the output circuit 30 at an end of the first PWM cycle, as indicated by a circle, is higher than the voltage threshold indicated by the single-dot broken line.

In order to address such an issue, there is a method in which the cycle stop circuit 14 does not output the cycle stop signal in cases in which the output voltage is higher than the voltage threshold. There is also a method in which the internal command circuit 11 stops output of the PWM signal of the signal output circuit 15 after elapse of a predetermined wait time after the signal output circuit 15 has output one cycle's worth of the PWM signal. However, in such methods an issue arises of a drop in efficiency due to the control circuit 10 having to stop processing during the wait time. In order to address this issue, there is a method in which the control circuit 10 performs other processing during this wait time. However, this gives rise to a need to adjust a timing of such other processing, complicating commands to the control circuit 10.

Moreover, there is also a method in which a delay time generating circuit for generating a predetermined delay time is provided externally to the control circuit 10. Output of the PWM signal is then stopped after elapse of the delay time in the signal output circuit 15 by outputting a stop signal to the delay time generating circuit. However, this method unfortunately increases the scale of a circuit. Moreover, components configuring the output circuit 30 need to be replaced every time the delay time is adjusted.

Explanation follows regarding a power source system 100 according to an exemplary embodiment of the present disclosure. Note that description follows regarding only points of difference to the related technology.

Figure 4:
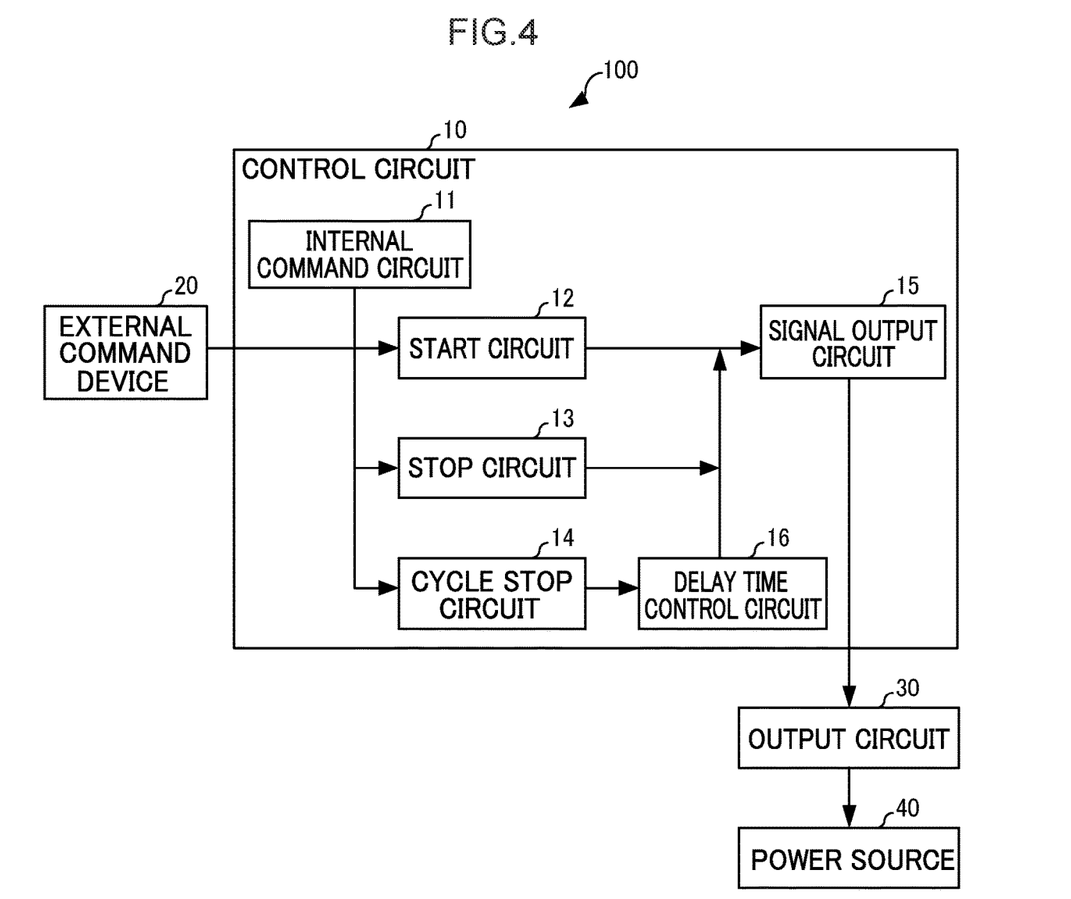
FIG. 4 is a block diagram illustrating an example of a hardware configuration of a power source system according to an exemplary embodiment of the present disclosure.

As illustrated in FIG. 4, the control circuit 10 according to an exemplary embodiment of the present disclosure differs from the related technology in that a delay time control circuit 16 is provided between the cycle stop circuit 14 and the signal output circuit 15.

The delay time control circuit 16 is a circuit to output, to the signal output circuit 15, a delay signal, which is an instruction to stop output of the PWM signal after elapse of a predetermined delay time (hereinafter simply referred to as "delay time") from an end of a cycle of the PWM signal being output by the signal output circuit 15.

Next, description follows regarding a functional configuration of the control circuit 10 according to an exemplary embodiment of the present disclosure.

The cycle stop circuit 14 differs from the related technology in the point that, on receipt of a command signal from the internal command circuit 11 or the external command device 20, the cycle stop circuit 14 outputs a cycle stop signal to the delay time control circuit 16.

On receipt of the cycle stop signal from the cycle stop circuit 14, the delay time control circuit 16 outputs a delay signal to the signal output circuit 15.

On receipt of the delay signal from the delay time control circuit 16, the signal output circuit 15 continues to output the PWM signal until elapse of a delay time from the end of the cycle of the PWM signal being output when the delay signal was received. In the following, the cycle of the PWM signal being output when the signal output circuit 15 received the delay signal is called a second PWM cycle. Then after elapse of the delay time from the end of the second PWM cycle, the signal output circuit 15 stops output of the PWM signal to the output circuit 30. Stopping of the output of the PWM signal of the signal output circuit 15 can thereby be delayed without affecting other circuits. For example, in cases in which the cycle stop circuit 14 is used to stop another circuit other than the signal output circuit 15, the exemplary embodiment of the present disclosure enables delay to be performed only in relation to stopping of the output of the PWM signal of the signal output circuit 15, and enables other circuits to operate unaffected.

Note that the delay time may be changed by a user re-writing a special functional register (SFR) of the delay time control circuit 16. This accordingly enables the delay time to be easily changed according to the product incorporating the delay time control circuit 16 or the application or the like thereof. Moreover, output to the output circuit 30 of the PWM signal can be stopped immediately after the end of the second PWM cycle by setting zero as the delay time for the signal output circuit 15.

Moreover, the delay time control circuit 16 may determine the delay time based on a voltage threshold and based on the output voltage at an end of the cycle of the PWM signal. Specifically, the delay time control circuit 16 may determine, as the delay time, a value not less than a value calculated by dividing a difference between the voltage threshold and the output voltage at the end of the cycle of the PWM signal by an amount the output voltage is changing per unit time. Moreover, a device other than the delay time control circuit 16 may determine the delay time based on the voltage threshold and based on an output voltage at the end of the cycle of the PWM signal.

Figure 5:
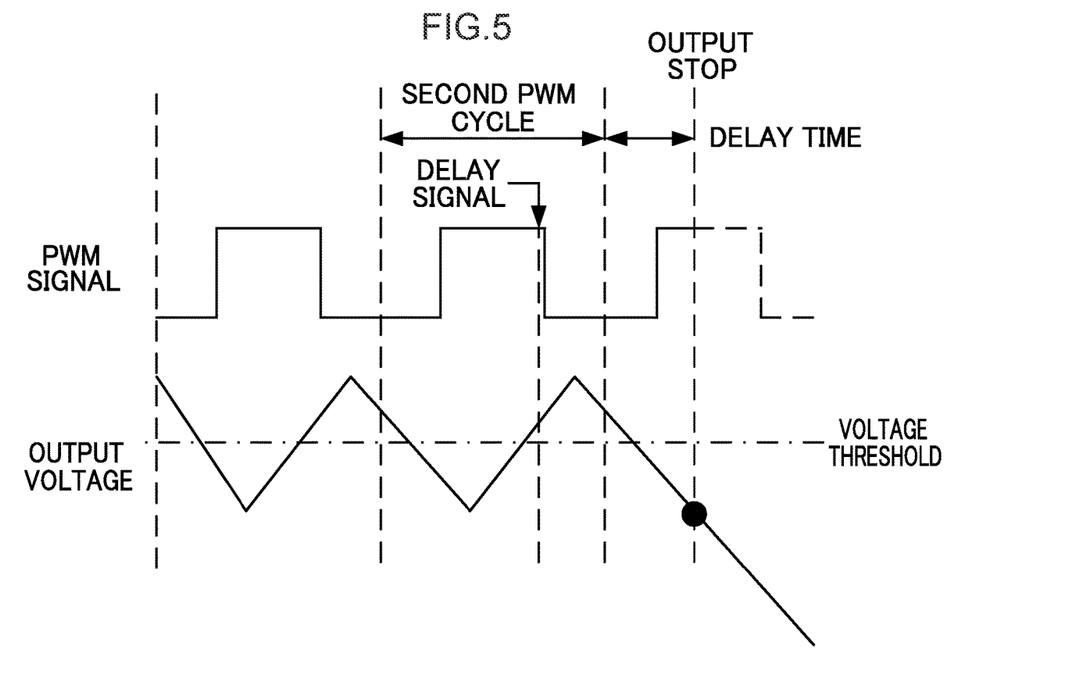
FIG. 5 is a schematic diagram to accompany description of an output voltage at elapse of a delay time after an end of a second cycle of a PWM signal.

FIG. 5 illustrates an example of a PWM signal at the top of FIG. 5 and a corresponding output voltage at the bottom of FIG. 5. As illustrated in FIG. 5, the output voltage indicted by a circle is not more than the voltage threshold as long as the delay time has elapsed from the end of the second PWM cycle. This means that even in cases in which the output voltage is higher than the voltage threshold at the end of the second PWM cycle, the output of the PWM signal can still be stopped from a point in time when the output voltage was not more the voltage threshold.

Figure 6:
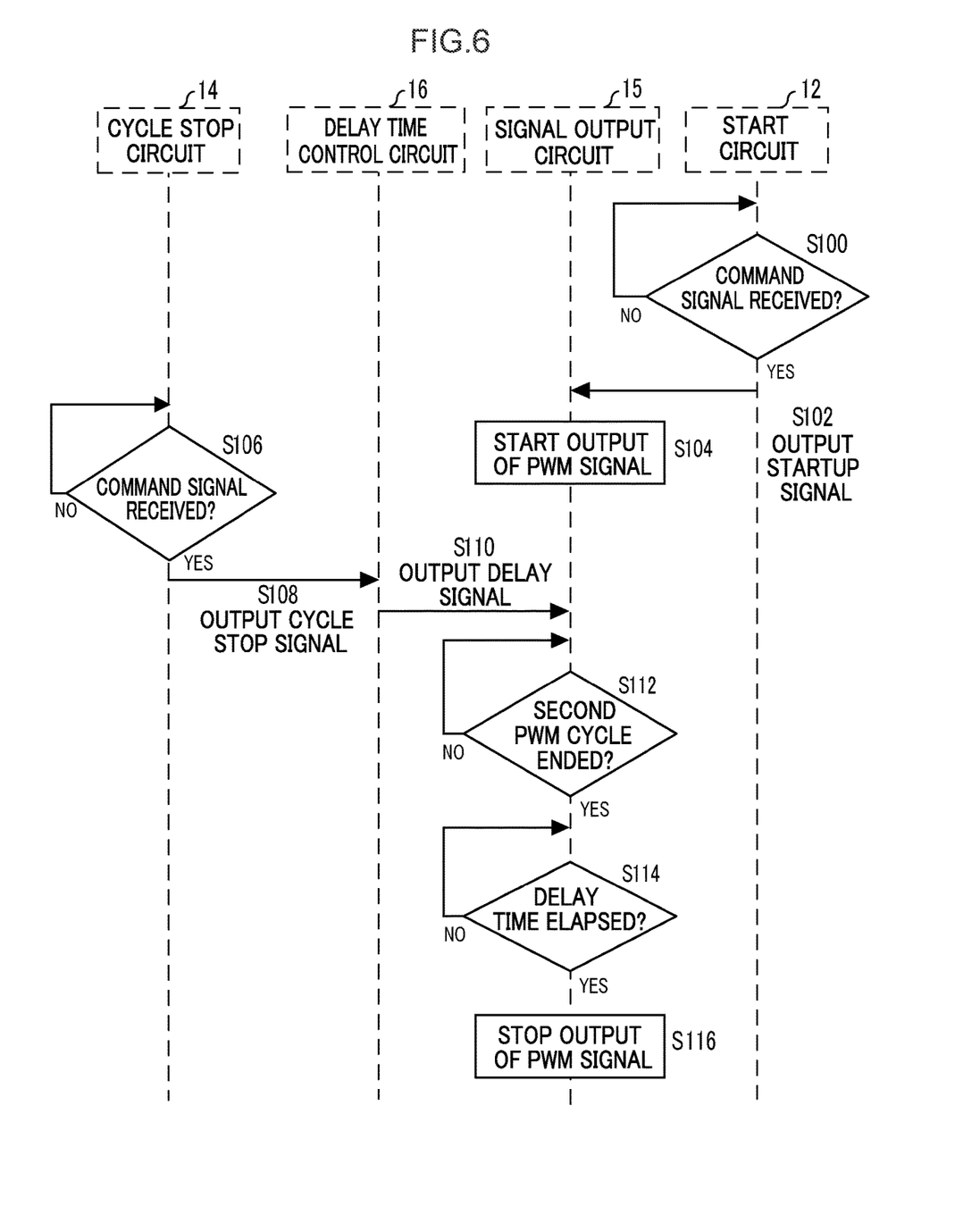
FIG. 6 is a sequence chart illustrating an example of a flow of control processing in a control circuit according to an exemplary embodiment of the present disclosure.

Next, description follows regarding a flow of control processing in the control circuit 10 according to an exemplary embodiment of the present disclosure, with reference to FIG. 6.

At step S100 of FIG. 6, the start circuit 12 is on standby until a command signal is received from the internal command circuit 11 or the external command device 20. The start circuit 12 transitions to step S102 when a command signal has been received (step S100: YES).

At step S102, the start circuit 12 outputs a startup signal to the signal output circuit 15.

At step S104, the signal output circuit 15 starts output to the output circuit 30 of a generated PWM signal.

At step S106, the cycle stop circuit 14 is on standby until a command signal is received from the internal command circuit 11 or the external command device 20. The cycle stop circuit 14 transitions to step S108 when a command signal has been received (step S106: YES).

At step S108, the cycle stop circuit 14 outputs a cycle stop signal to the delay time control circuit 16.

At step S110, the delay time control circuit 16 outputs a delay signal to the signal output circuit 15.

At step S112, the signal output circuit 15 is on standby until the end of the second PWM cycle. The signal output circuit 15 transitions to step S114 at the end of the second PWM cycle (step S112: YES).

At step S114, the signal output circuit 15 is on standby until a delay time has elapsed. The signal output circuit 15 transitions to step S116 when the delay time has elapsed (step S114: YES).

At step S116, the signal output circuit 15 stops output of the PWM signal to the output circuit 30. The present control processing is then ended.

In this manner, the delay time control circuit 16 according to the exemplary embodiment of the present disclosure outputs the delay signal to the signal output circuit 15 when the cycle stop signal has been received from the cycle stop circuit 14. The signal output circuit 15 is accordingly able to stop output of the PWM signal when the output voltage is not more than the voltage threshold.

Note that the delay time control circuit 16 outputting the delay signal to the signal output circuit 15 is not limited to cases in which the cycle stop signal has been received from the cycle stop circuit 14. For example, the delay time control circuit 16 may output the delay signal to the signal output circuit 15 in cases in which a command signal has been received from the internal command circuit 11 or the external command device 20.

Moreover, instead of the control circuit 10, the internal command circuit 11, the start circuit 12, the stop circuit 13, the cycle stop circuit 14, and the signal output circuit 15, a central processing unit (CPU; processor) may be applied to perform control using software.

Moreover, the configuration of the power source system 100 described in the exemplary embodiment of the present disclosure is merely an example thereof, and obviously the configuration may be modified within a scope not departing from the spirit of the exemplary embodiments.

The following supplements are also disclosed in relation to the above exemplary embodiment.

Supplement 1

A delay time control circuit, wherein the delay time control circuit outputs a delay signal to a signal output circuit for outputting a PWM signal to an output circuit, the delay signal being an instruction to stop output of the PWM signal after elapse of a predetermined delay time from an end of a cycle of the PWM signal being output by the signal output circuit.

Supplement 2

The delay time control circuit of supplement 1, wherein the predetermined delay time is changeable.

Supplement 3

The delay time control circuit of supplement 1 or supplement 2, wherein the predetermined delay time is determined based on a predetermined voltage threshold and based on an output voltage output by the output circuit at an end of the cycle.

Supplement 4

A control circuit including:
a delay time control circuit that outputs a delay signal; and
a signal output circuit for outputting a PWM signal to an output circuit,
wherein the signal output circuit, upon receipt of the delay signal from the delay time control circuit, is configured to continue output of the PWM signal until elapse of a predetermined delay time from an end of a cycle of the PWM signal being output when the delay signal was received, and to stop output of the PWM signal after elapse of the predetermined delay time from the end of the cycle of the PWM signal being output when the delay signal was received.

Supplement 5

The control circuit of supplement 4, further including a cycle stop circuit that outputs a cycle stop signal to the delay time control circuit, the cycle stop signal comprising an instruction to stop output of the PWM signal from an end of a cycle of the PWM signal being output by the signal output circuit, wherein the delay time control circuit outputs the delay signal to the signal output circuit based on receipt of the cycle stop signal.

What is claimed is:

1. A delay time control circuit, wherein the delay time control circuit outputs a delay signal to a signal output circuit for outputting a PWM signal to an output circuit, the delay signal being an instruction to stop output of the PWM signal after elapse of a predetermined delay time from an end of a cycle of the PWM signal being output by the signal output circuit.

2. The delay time control circuit of claim 1, wherein the predetermined delay time is changeable.

3. The delay time control circuit of claim 1, wherein the predetermined delay time is determined based on a predetermined voltage threshold and based on an output voltage output by the output circuit at an end of the cycle.

4. A control circuit, comprising:

a delay time control circuit that outputs a delay signal; and a signal output circuit for outputting a PWM signal to an output circuit, wherein the signal output circuit, upon receipt of the delay signal from the delay time control circuit, is configured to continue output of the PWM signal until elapse of a predetermined delay time from an end of a cycle of the PWM signal being output when the delay signal was received, and to stop output of the PWM signal after elapse of the predetermined delay time from the end of the cycle of the PWM signal being output when the delay signal was received.

5. The control circuit of claim 4, further comprising a cycle stop circuit that outputs a cycle stop signal to the delay time control circuit, the cycle stop signal comprising an instruction to stop output of the PWM signal from an end of a cycle of the PWM signal being output by the signal output circuit, wherein the delay time control circuit outputs the delay signal to the signal output circuit based on receipt of the cycle stop signal.

* * * * *